(12) United States Patent
Cavallaro et al.

(10) Patent No.: US 8,773,202 B2
(45) Date of Patent: Jul. 8, 2014

(54) HIGH PERFORMANCE CLASS AB OPERATIONAL AMPLIFIER

(75) Inventors: MarcoOrazio Cavallaro, Catania (IT); Serge Ramet, Jarrie (FR); Tiziano Chiarillo, Tremestieri Etneo (IT)

(73) Assignees: STMicroelectronics (Grenoble 2) SAS, Grenoble (FR); STMicroelectronics s.r.l., Agrate Brianza (MB) (IT)

( * ) Notice: Subject to any disclaimer, the term of this patent is extended or adjusted under 35 U.S.C. 154(b) by 45 days.

(21) Appl. No.: 13/562,071

(22) Filed: Jul. 30, 2012

(65) Prior Publication Data
US 2013/0088298 A1    Apr. 11, 2013

(30) Foreign Application Priority Data

Oct. 7, 2011 (IT) ............................. MI2011A1832

(51) Int. Cl.
*H03F 3/45* (2006.01)

(52) U.S. Cl.
USPC .......................................... 330/255; 330/261

(58) Field of Classification Search
USPC .......................................... 330/255, 257, 261
See application file for complete search history.

(56) References Cited

U.S. PATENT DOCUMENTS

| | | | |
|---|---|---|---|
| 5,285,168 A | 2/1994 | Tomatsu et al. | |
| 6,084,476 A | 7/2000 | Hamanishi et al. | |
| 7,154,332 B2 * | 12/2006 | Tsuchi | 330/255 |
| 7,170,351 B2 * | 1/2007 | Shimatani | 330/255 |
| 7,339,429 B2 * | 3/2008 | Maki | 330/253 |
| 7,728,669 B2 * | 6/2010 | Liu | 330/255 |
| 8,310,428 B2 * | 11/2012 | Nakayama | 345/96 |
| 8,390,609 B2 * | 3/2013 | Tsuchi | 345/211 |

FOREIGN PATENT DOCUMENTS

EP        0 123 275 A2    10/1984

OTHER PUBLICATIONS

Italian Search Report, application No. MI2011A001832, dated Jul. 12, 2012, pp. 7.
Ludwig G. A. Callewaert et al., Class AB CMOS Amplifiers with High Efficiency, IEEE Journal of Solid-State Circuits, vol. 25, No. 3, Jun. 1990, pp. 684-691.
Ron Hogervorst et al., A Compact Power-Efficient 3 V CMOS Rail-to-Rail Input/Output Operational Amplifier for VLSI Cell Libraries, IEEE Journal of Solid-State Circuits, vol. 29, No. 12, Dec. 1994, pp. 1505-1513.
G. Palmisano et al., article, Very efficient CMOS low-voltage output stage, Electronics Letters, Oct. 12, 1995, vol. 31, No. 21, pp. 1830-1831.
Takashi Kurashina et al., A High Performance Class AB Current Conveyor, IEEE, Jan. 1998, pp. 143-146.
H.A. Aslanzadeh et al., A Low Power 25MS/S 12-Bit Pipelined Analog to Digital Converter for Wireless Applications, Aug. 2003 IEEE, SSMSD, pp. 38-42.

* cited by examiner

*Primary Examiner* — Henry Choe
(74) *Attorney, Agent, or Firm* — Hogan Lovells US LLP (57) ABSTRACT

A class AB operational amplifier includes an input stage, an output stage and a level shifter stage to control the quiescent current of the output stage and to transfer the signal from the input stage to the output stage, and a control circuit of the level shifter stage. The control circuit includes a transistor differential pair having a differential input terminals and the differential voltage at the differential terminals of the differential pair controls the level shifter stage.

15 Claims, 4 Drawing Sheets

HIGH PERFORMANCE CLASS AB OPERATIONAL AMPLIFIER

RELATED APPLICATIONS

This application is a translation of and claims the priority benefit of Italian patent application number MI2011A001832, filed on Oct. 7, 2011, entitled High Performance Class AB Operational Amplifier, which is hereby incorporated by reference to the maximum extent allowable by law.

FIELD OF THE INVENTION

The present invention relates to a high performance class AB operational amplifier.

The design of high-accuracy analogue circuits is becoming a difficult task with the scaling down of supply voltages and transistor channel lengths of the current mixed-signal integrated circuits. Most of these circuits require the use of high performance active cell: the operational amplifier (OpAmp). Furthermore, some low-IF transceivers make use of complex filters which require operational amplifier with a very high gain-bandwidth product in order to have enough loop gain at the higher band limit. Ultra low power circuit imposes a current reduction in order to increase the battery life-time in mobile handsets. Unfortunately, the bandwidth depends on the technology and the current used in the OpAmp output stage and hence the only way to reduce the current consumption is to reduce the complexity/consumption of the circuits around the OpAmp such as bias, common mode feed-back, start-up circuit. Designers are continuously working toward tradeoff solutions between gain, input/output swings, speed, power consumption, noise, etc.

The class-AB output stage topology allows driving a large load capacitor with a small output stage bias current. Furthermore, it gives a boost in the Gain Bandwidth product (GBW). Despite to its property, the most important problem designing class AB OpAmps is the accurate control of the output current which depends on process and supply voltage variations. To solve this problem it is necessary to introduce control circuits.

Figure 1:
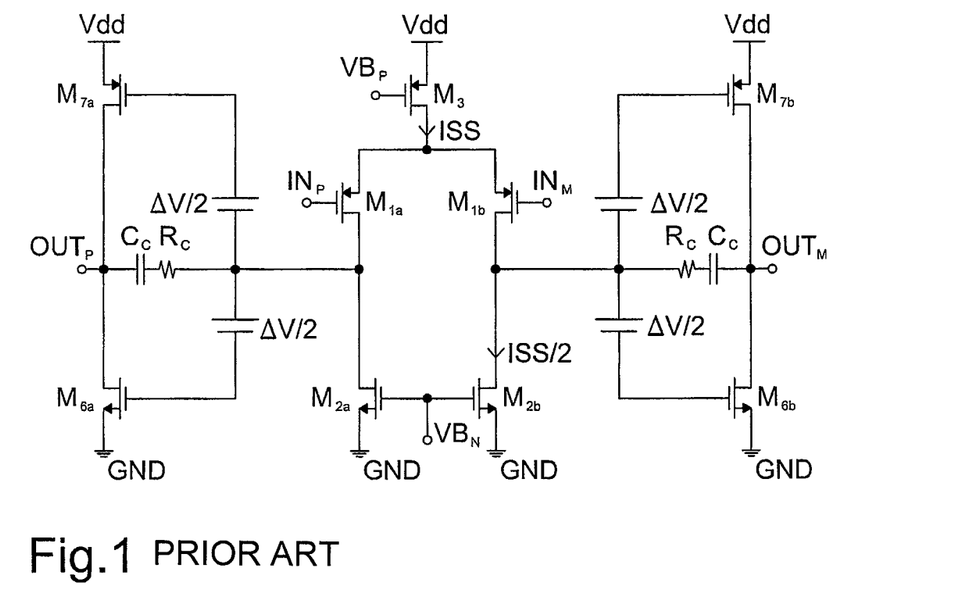
FIG. 1 shows an ideal circuit scheme of a class AB operational amplifier output stage.

An ideal circuit to implement a class AB output stage is shown in FIG. 1. The circuit comprises an input stage comprising a differential pair of PMOS transistors $M_{1a}$, $M_{1b}$ having a differential input signal at the input terminals $IN_P$, $IN_M$. The drain terminals of the transistor of the differential pair are connected to the output terminals $OUT_P$, $OUT_M$ by means of the compensation network constituted of a series of a capacitor $C_c$ and a resistance $R_c$. The output terminals $OUT_P$, $OUT_M$ belonging to two output stages each one comprising a couple of transistor PMOS $M_{7a}$, $M_{7b}$ and NMOS $M_{6a}$, $M_{6b}$ having the drain terminal in common and connected to the output terminals $OUT_P$, $OUT_M$ and the two level shifter $\Delta v/2$ connected between the output terminals of the differential pair and the gate terminals of the transistor PMOS $M_{7a}$, $M_{7b}$ and NMOS $M_{6a}$, $M_{6b}$ of the couples.

The biasing of the differential pair is performed by means of the transistors NMOS $M_{2a}$, $M_{2b}$ having the gate terminal connected to the bias voltage $VB_N$ and the source terminals of the differential pair transistors connected to the drain terminal of a PMOS transistor $M_3$ having the gate terminal connected to a bias voltage $VB_p$ and the source terminal connected to the supply voltage Vdd as the source terminals of the transistors $M_{7a}$, $M_{7b}$; in this way a bias current Iss/2 flows in each branch of the differential pair.

The circuit in FIG. 1 allows to control the bias current and transfer the signal to both the NMOS and PMOS transistor of the output stage using two level shifter $\Delta v/2$.

Figure 2:
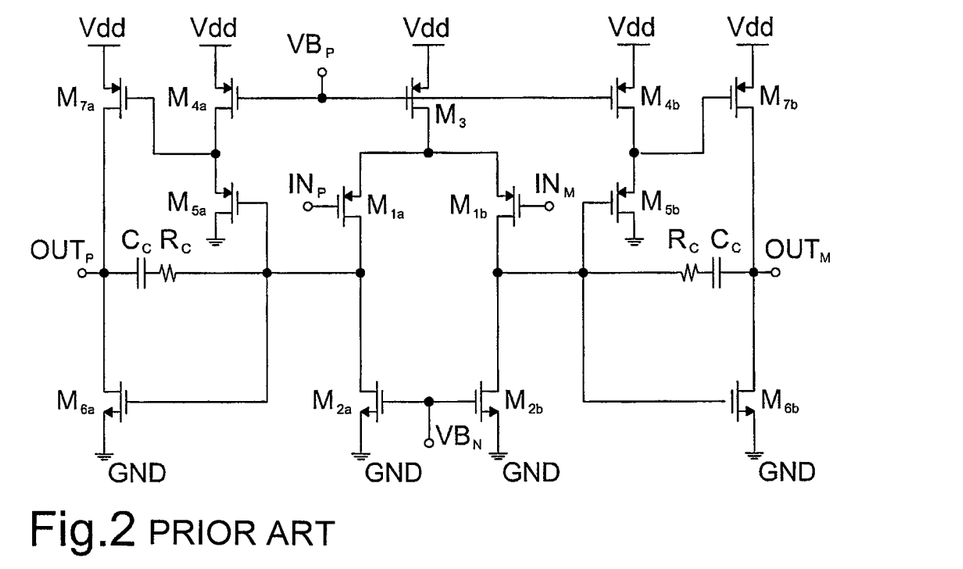
FIG. 2 shows a circuit implementation of the circuit scheme in FIG. 1.

A practical implementation of the circuit in FIG. 1 is shown in FIG. 2. The two level shifter $\Delta v/2$ of the output stages are implemented by means of a PMOS and a NMOS transistor arranged in series $M_{4a}$, $M_{5a}$ and $M_{4b}$, $M_{5b}$ and connected between the supply voltage Vdd and ground (GND). The gate terminals of the transistors $M_{5a}$, $M_{5b}$ are connected to the output terminals of the differential pair while the gate terminals of the transistors $M_{4a}$, $M_{4b}$ are connected to the bias voltage $VB_p$.

The circuit topology in FIG. 2 assures the best performance in terms of GBW, power consumption and output voltage swing. Unfortunately, this topology has many drawbacks to be solved; the output-stage current is not controlled and depends on the process, mismatch of the MOS transistors and on the supply voltage. Furthermore, this topology is not at low voltage. The minimum supply voltage which can be used depends on the MOS transistors threshold $V_{TH}$ and is $V_{THN} + 2V_{THP}$ where $V_{THN}$ is the threshold of the NMOS transistor while $V_{THP}$ is the threshold of the PMOS transistor.

Figure 3:
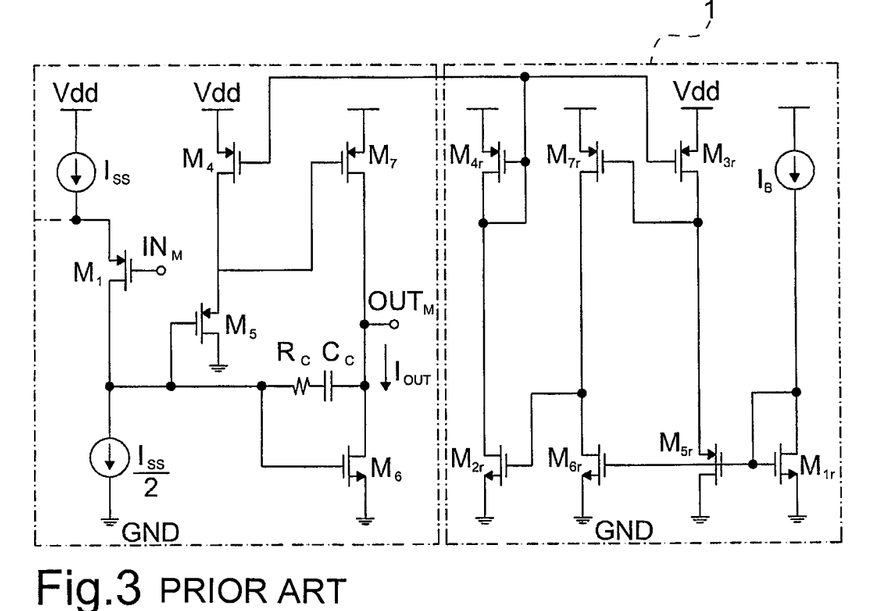
FIG. 3 shows a circuit implementation of the circuit scheme in FIG. 1.

Another circuit topology used is shown in FIG. 3. This circuit solution comprises the use of a circuit 1 to control the output current Tout of the class AB output stage in FIG. 2; FIG. 3 shows only a part of the circuit in FIG. 2 which is relative to the input $IN_M$ and the output $OUT_M$. The gate terminal of the transistor $M_4$ is not connected with the bias voltage $VB_p$ but with the circuit 1, more precisely the gate terminal of the transistor $M_4$ is connected with the gate terminal and the drain terminal of a PMOS transistor $M_{4r}$ and with the gate terminal of a PMOS transistor $M_3$, so that the transistor $M_{4r}$ and $M_{3r}$ form a current mirror. Another current mirror comprises the transistor $M_{1r}$ and $M_{6r}$ adapted to mirror the bias current $I_B$ in the PMOS transistor $M_{7r}$ having the gate terminal connected with the drain terminal of the transistor $M_{3r}$ and with the source terminal of a PMOS transistor $M_{5r}$ the drain terminal of which is connected to ground GND and the gate terminal is connected with the gate terminal of the transistors $M_{1r}$ and $M_{6r}$. Loop consists of transistors $M_{3r}$, $M_{7r}$, $M_{2r}$ and $M_{4r}$. The gate-source voltage of the transistor $M_{5r}$ will be adjusted corresponding to the currents flowing through the transistors $M_{7r}$ and $M_{6r}$. The current flowing through the transistor $M_{5r}$ is copied in the transistor $M_4$ by the transistor $M_{3r}$ and the gate-source voltage of the transistor $M_5$ is adjusted to a right level forcing the output stage current to the controlled level.

The circuit in FIG. 3 is known from: H. A. Aslanzadeh, S. Mehrmanesh, M. B. Vahidfar, A. Q. Safarian, "A low power 25 Ms/s 12-bit pipelined analog to digital converter for wireless applications," IEEE 2003.

This solution is not suitable for very low current consumption application; in the case of low bias current the output current depends on the process variation of the transistor and the performances of the class AB output stage of the operational amplifier are reduced.

In view of the state of the art, the object of the present invention is to provide a high performance class AB operational amplifier which overcomes the above-mentioned drawbacks.

SUMMARY OF THE INVENTION

According to the present invention, this object is achieved by means of a class AB operational amplifier comprising an input stage, an output stage and a level shifter stage adapted to control the quiescent current of the output stage and to transfer the signal from the input stage to the output stage, a control circuit of the level shifter stage, characterized in that the control circuit comprises at least one transistor differential pair having differential input terminals, said control circuit being configured so that the differential voltage at the differential terminals of the transistor differential pair controls the level shifter stage.

BRIEF DESCRIPTION OF THE DRAWINGS

The features and advantages of the present invention will become apparent from the following detailed description of an embodiment thereof, illustrated only by way of non-limitative example in the annexed drawings, in which.

DETAILED DESCRIPTION

Figure 4:
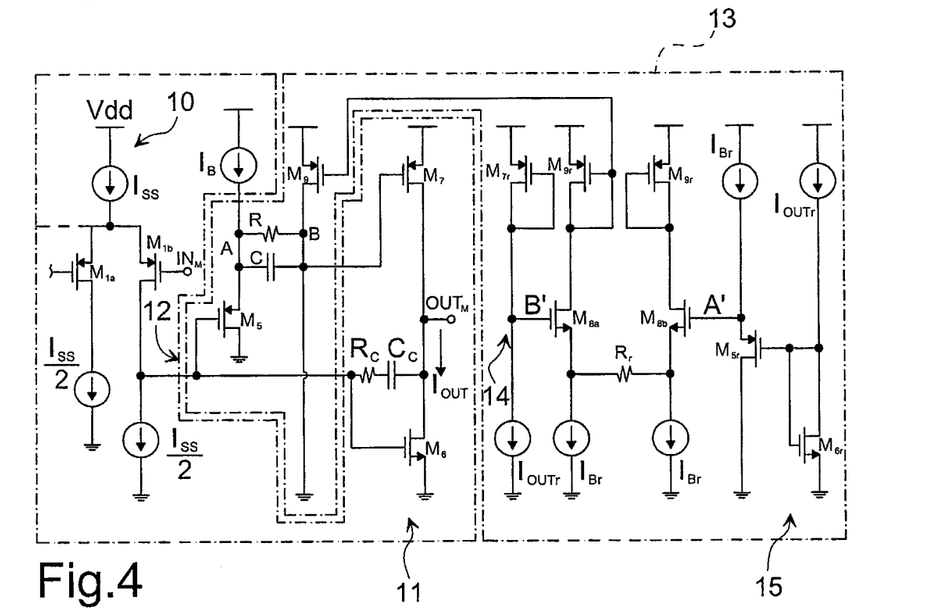
FIG. 4 shows a class AB operational amplifier according to the present invention.

FIG. 4 shows a class AB operational amplifier according to the present invention. The operational amplifier comprising an input stage 10, an output stage 11, a level shifter stage 12 adapted to control the bias current of the output stage and to transfer the signal from the input stage to the output stage, a control circuit 13 of the level shifter stage. Specifically, FIG. 4 shows one part of the class AB operational amplifier according to the present invention which comprises two symmetrical parts for each branch of the input stage that is two parts identical to each other.

The input stage 10 comprising a differential pair of transistors $M_{1a}$, $M_{1b}$, preferably PMOS transistor, having a differential input signal at the input terminals $IN_P$, $IN_M$ and a common node. The input stage 10, similar to the input stage 1 in FIG. 1, has a bias current Iss/2 flowing through the transistor $M_{1a}$, $M_{1b}$.

The output stage 11 comprises a couple of a first $M_6$ and a second $M_7$ output transistors, in series to each other, and arranged between a first voltage reference Vdd and a second voltage reference GND and being interconnected at an output terminal OUT of the operational amplifier; the first output transistor has a control terminal connected to an output terminal of the input stage 10.

The level shifter stage 12 comprises a couple of a first $M_5$ and a second $M_9$ intermediate transistors, connected in series to each other by means of an impedance, that is the parallel of a resistance R and a capacitor C, and coupled between a first voltage reference Vdd and a second voltage reference GND; specifically, the transistors of the level shifter stage 12 are MOS transistors and the source terminal A of the first transistor $M_5$ is coupled with the drain terminal B of the second transistor $M_9$ by means of the parallel of the resistance R and the capacitor C. The first intermediate transistor $M_5$ has the control terminal connected with one output terminal of the input stage 10 and the second intermediate transistor $M_9$ has the output terminal connected with the control terminal of the second output transistor $M_7$; the second intermediate transistor $M_9$ has the control terminal connected to an output terminal of a control circuit 13. The second intermediate transistor acts as a current generator.

The control circuit 13 comprises at least one transistor differential pair $M_{8a}$, $M_{8b}$ having a differential input terminals B' and A'. The differential voltage $V_{A'}-V_{B'}$ applied at the input terminals A' and B' controls the level shifter stage 12. In fact the level shifter stage 12 controls the output quiescent current Iout of the output stage 11 of the operational amplifier by means of the voltage difference between the voltages at the terminals A and B; the control circuit 13 is configured so that the differential voltage $V_{A'}-V_{B'}$ is equal to the differential voltage $V_A-V_B$ applied at the terminals A and B. Particularly, the level shifter stage 12 fixes the voltage $V_A$ while the voltage $V_B$ is varied by the control circuit 13.

The control circuit 13 comprises replica circuits based on transistors $M_{7r}$, $M_{6r}$ and $M_{5r}$. The term "replica" is used herein to refer to a copy or duplicate of an original, which may be of different scale to the original. Preferably, the transistors $M_{7r}$, $M_{6r}$ and $M_{5r}$ are a scaled version of transistors $M_7$, $M_6$ and $M_5$ respectively. The scaling value depends on the current ratio desired between transistors $M_5$ and $M_{5r}=M_5/k$, $M_6$ and $M_{6r}=M_6/n$, $M_7$ and $M_{7r}=M_7/n$. This ratio of current in the stages 10, 11 and 12 and in the replica-circuit branches is configured to reduce the current consumption of the control circuit 13.

The control circuit 13 comprises circuit branches 14, 15 connected with the input terminals B', A' of the differential pair $M_{8a}$, $M_{8b}$; the circuit branches 14, 15 are replica circuits of the respective circuit branches which are connected with the respective terminals B and A and which are formed by the transistor $M_7$ and $M_5$, $M_6$ among the output stage 11 and the level shifter stage 12.

The currents of the transistors $M_{7r}$, $M_{6r}$, $M_{6r}$ and $M_{5r}$ are fixed through current sources to a scaled value of the desired current flowing through the transistors $M_7$, $M_6$ and $M_5$. This allows to evaluate the desired voltage on the node A and B with process and temperature variations. The evaluated value is available at the node A' and B'.

The control circuit 13 comprises first and second circuit branches 14, 15 respectively formed by the transistor $M_{7r}$ wherein the bias current Ioutr flows, and by the transistor $M_{6r}$ wherein the bias current Ioutr flows and the transistor $M_{5r}$ having the gate terminal connected with the gate terminal and with the drain terminal of the transistor $M_{6r}$. The drain and source terminals of the transistors $M_{7r}$, $M_{5r}$ are connected to the terminals of the differential pair $M_{8a}$, $M_{8b}$ so as the differential voltage $V_{A'}-V_{B'}$ is proportional to the bias current Ioutr.

A transistor $M_{9r}$ forms a mirror with the transistor $M_9$ of the level shifter stage. The transistor $M_{9r}$ has the gate and the drain terminals connected with the drain terminal of the transistor $M_{8a}$; another transistor $M_{9r}$ has the gate and the drain terminals connected only with the drain terminal of the transistor $M_{8b}$.

The differential pair $M_{8a}$, $M_{8b}$ compares the voltages $V_{A'}$ and $V_{B'}$ and change the value of current in the transistor $M_{9r}$ from $I_{Br}$ to the value $I_{Br}-\Delta I$ with $\Delta I=(V_{A'}-V_{B'})/R_r$. This current is mirrored in the transistor $M_9$ with a mirror factor k. The current flowing through $M_9$ is $k \cdot (I_{Br}+\Delta I)$. If the currents $I_B$ and $I_{Br}$ are related by $I_B=k \cdot I_{Br}$, an extra current $k \cdot \Delta I$ flows through the resistor R and produces a variation $k \cdot \Delta I \cdot R$ between the voltage of the node A and B, that is $V_A-V_B=k \cdot \Delta I \cdot R=k \cdot R \cdot (V_{A'}-V_{B'})/R_r$. If the relation chosen between R and $R_r$ is $R_r=k \cdot R$ then it has $V_A-V_B=V_{A'}-V_{B'}$; the control circuit 13 guarantees at the node A and B the voltage which is necessary in order to have the desired current Iout=n•Ioutr in the output stage $M_7$–$M_6$ with process and temperature variations, that is each variation of the current Ioutr determines a variation of the current Iout of the output stage 11 of the operational amplifier in class AB.

Since the transistors $M_{8a}$, $M_{8b}$ are configured as follower transistors, the voltage difference at the terminals of the resistance $R_r$ is the voltage difference $V_{A'}$–$V_{B'}$. The voltage $V_{A'}$ is given by the sum of the gate-source voltages of the transistors $M_{6r}$ and $M_{5r}$, that is $$V_{A'} = |V_{T_p}| + \sqrt{\frac{I_{Br}}{K_p\left(\frac{W}{L}\right)_{5r}}} + V_{T_n} + \sqrt{\frac{I_{outr}}{K_n\left(\frac{W}{L}\right)_{6r}}}$$

wherein $V_{T_p}$ is the voltage threshold to the PMOS transistor, $V_{T_n}$ is the voltage threshold to the NMOS transistor, W/L is the form factor and $K_p$ and $K_n$ are constants. The voltage $V_{B'}$ is given by the difference between the supply voltage Vdd and the gate-source voltage of the transistor $M_{7r}$, that is $$V_{B'} = Vdd - |V_{Tp}| - \sqrt{\frac{I_{outr}}{K_n\left(\frac{W}{L}\right)_{7r}}}$$

The voltage $V_A$ is given by the sum of the gate-source voltages of the transistors $M_6$ and $M_5$, that is $$V_{A'} = V_{T_N} + \sqrt{\frac{I_{out}}{K_n\left(\frac{W}{L}\right)_6}} + |V_{Tp}| + \sqrt{\frac{I_B}{K_p\left(\frac{W}{L}\right)_5}}$$

and the voltage $V_B$ is given by the difference between the supply voltage Vdd and the gate-source voltage of the transistor $M_7$, that is $$V_{B'} = Vdd - |V_{Tp}| - \sqrt{\frac{I_{out}}{K_p\left(\frac{W}{L}\right)_7}}$$

Since $V_A$–$V_B$=$V_{A'}$–$V_{B'}$ with $R_r$=k•R and $I_B$=k•$I_{Br}$ by selecting $$\left(\frac{W}{L}\right)_5 = k\left(\frac{W}{L}\right)_{5r}, \left(\frac{W}{L}\right)_6 = n\left(\frac{W}{L}\right)_{6r} \text{ and } \left(\frac{W}{L}\right)_7 = n\left(\frac{W}{L}\right)_{7r}$$

it occurs Iout=n×Ioutr.

This configuration has the advantage to eliminate the dependency of the output stage quiescent current on transistor process variation and supply voltage while controlling this current in an open loop manner which does not affect the frequency response and stability of the amplifier.

Figure 5:
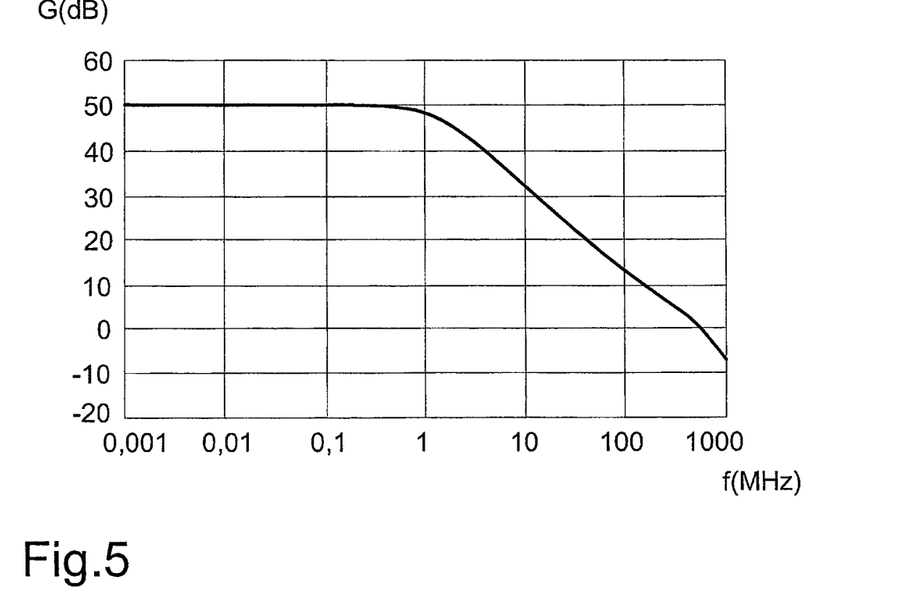
FIGS. 5 and 6 are time diagrams of the gain and phase of the circuit in FIG. 4 deriving from simulations.
Figure 6:
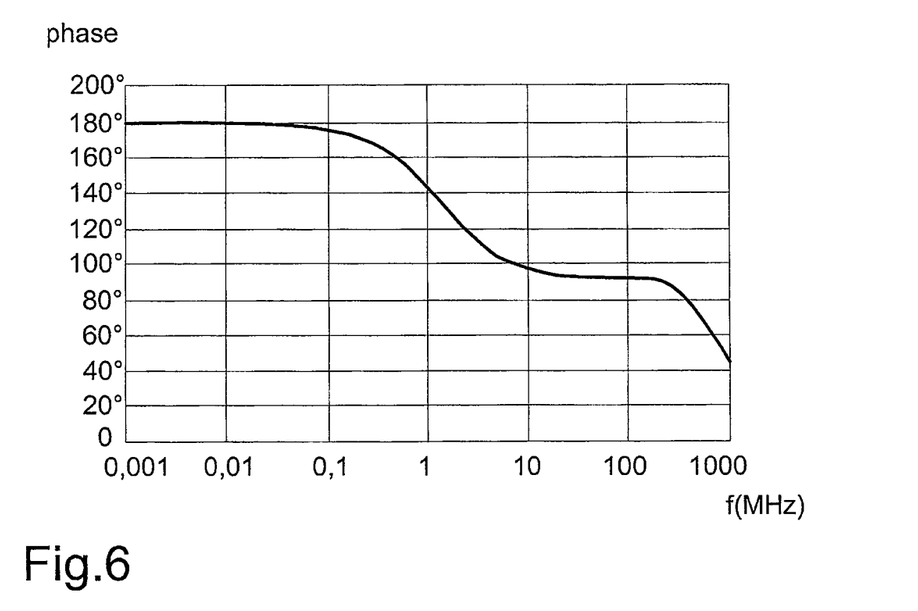

FIGS. 5 and 6 show the differential-mode open-loop gain G in decibel and the phase in degrees of the operation amplifier in FIG. 4 when it is connected in unity gain feed-back with a current consumption of 150 microampere, a power supply of 1.2 V and a load capacitor of 100 fF single-ended. These curves show a perfect two pole system. The operational amplifier exhibits a DC gain G of 50 dB and a unity-gain frequency of 500 MHz and 60 degree of phase margin.

Figure 7:
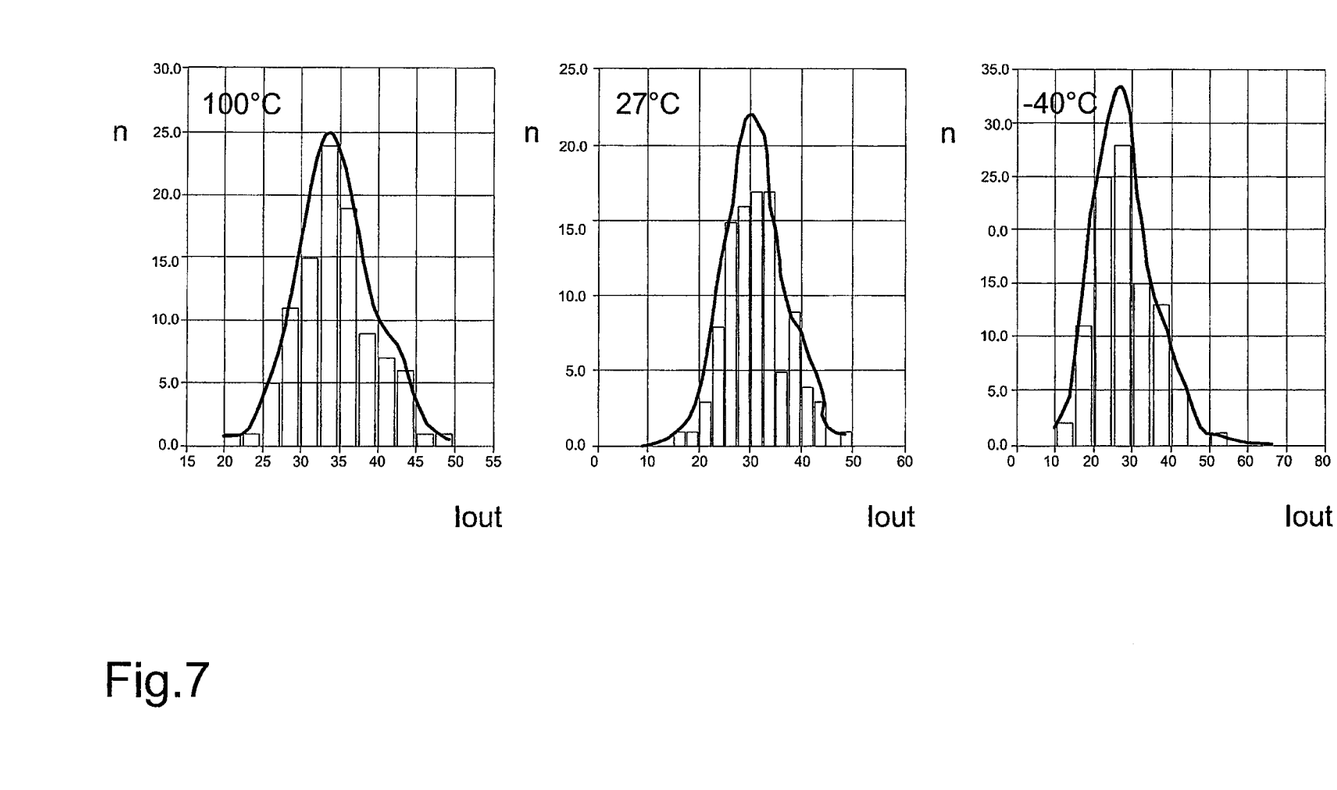
FIG. 7 shows montecarlo simulations of the output stage current of the class AB operational amplifier in FIG. 4.

FIG. 7 shows the montecarlo simulations with process and temperature variation; in said simulations the number of cases n is in ordinate and the current Iout (in microampere) is in abscissa, with the total number of cases equal to 100, at 100° C., 27° C. and −40° C. The montecarlo simulations show a very accurate control of the output-stage current.

As above mentioned FIG. 4 shows one part of the class AB operational amplifier according to the present invention which comprises two symmetrical parts for each branch of the input stage, that is two parts identical to each other and wherein each one of two parts includes the circuits 11, 12 and 13 shown in FIG. 4.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

The invention claimed is:

1. A class AB operational amplifier comprising an input stage, an output stage and a level shifter stage adapted to control the quiescent current of the output stage and to transfer the signal from the input stage to the output stage, a control circuit of the level shifter stage, characterized in that the control circuit comprises at least one transistor differential pair having differential input terminals, said control circuit being configured so that the differential voltage at the differential terminals of the transistor differential pair controls the level shifter stage, characterized in that said control circuit comprises circuit means coupled with the input terminals of the transistor differential pair and wherein a first bias current flows, the control circuit being configured to control the quiescent current to be proportional to the amount of said first bias current, and characterized in that the level shifter stage comprises at least a first and a second intermediate transistors coupled in series by means of an impedance and the series being arranged between a first and a second reference voltage, the voltage across the impedance being said differential voltage at the differential input terminals of the transistor differential pair.

2. The operational amplifier according to claim 1, characterized in that said circuit means of the control circuit comprises a first and a second circuit branches connected with the respective input terminals of the differential pair, said circuit branches being a replica circuit of the two circuit branches of the output stage and the level shifter stage which are connected at the respective terminals of the impedance.

3. The operational amplifier according to claim 1, characterized in that said transistor differential pair comprises MOS transistor and a resistance arranged between the source terminals of the differential pair, said impedance comprising a further resistance and said resistance being proportional to the further resistance, said transistor differential pair being configured so that the voltage across the resistance is the differential voltage at the differential terminals of the differential pair.

4. The operational amplifier according to claim 3, characterized in that said control circuit comprises a first transistor forming with an intermediate transistor of the level shifter stage a current minor to mirror the current flowing through the transistor differential pair into the level shifter stage, said first transistor being a replica of said intermediate transistor.

5. The class AB operational amplifier of claim 1 further comprising an additional input stage, output stage, level shifter stage, and control circuit.

6. A class AB operational amplifier comprising:
an input stage;
an output stage;
a level shifter stage to control the bias current of the output stage and to transfer the signal from the input stage to the output stage; and
a control circuit of the level shifter stage,
wherein the level shifter stage comprises a first transistor and a second transistor, coupled together by an impedance, and wherein an intermediate node between the first transistor and the impedance is coupled to ground.

7. The class AB operational amplifier of claim 6 wherein the input stage comprises a differential pair of transistors.

8. The class AB operational amplifier of claim 7 wherein the transistors comprise PMOS transistors.

9. The class AB operational amplifier of claim 6 wherein the output stage comprises a first transistor and a second transistor, in series connection.

10. The class AB operational amplifier of claim 9 wherein the first transistor comprises a PMOS transistor and the second transistor comprises an NMOS transistor.

11. The class AB operational amplifier of claim 9 wherein a series-connected resistor and capacitor are coupled between a gate and a drain of the second transistor.

12. The class AB operational amplifier of claim 6 wherein the first transistor comprises a PMOS transistor and the second transistor comprises an NMOS transistor.

13. The class AB operational amplifier of claim 6 wherein the impedance comprises a resistor and a capacitor in parallel.

14. The class AB operational amplifier of claim 6 wherein the control circuit comprises a transistor differential pair.

15. The class AB operational amplifier of claim 14 further comprising a first circuit branch and a second circuit branch coupled to the transistor differential pair.

* * * * *

UNITED STATES PATENT AND TRADEMARK OFFICE
CERTIFICATE OF CORRECTION

PATENT NO.       : 8,773,202 B2
APPLICATION NO.  : 13/562071
DATED            : July 8, 2014
INVENTOR(S)      : MarcoOrazio Cavallaro et al.

It is certified that error appears in the above-identified patent and that said Letters Patent is hereby corrected as shown below:

On the Title Page, Item (30) M12001A1832 should be --MI2001A1832--

Signed and Sealed this
Thirtieth Day of September, 2014

Michelle K. Lee
*Deputy Director of the United States Patent and Trademark Office*

UNITED STATES PATENT AND TRADEMARK OFFICE
CERTIFICATE OF CORRECTION

| | |
|---|---|
| PATENT NO. | : 8,773,202 B2 |
| APPLICATION NO. | : 13/562071 |
| DATED | : July 8, 2014 |
| INVENTOR(S) | : MarcoOrazio Cavallaro, Serge Ramet and Tiziano Chiarillo |

It is certified that error appears in the above-identified patent and that said Letters Patent is hereby corrected as shown below:

TITLE PAGE: ITEM (30) M12001A1832 should be --MI2011A1832--

Signed and Sealed this
Twenty-third Day of December, 2014

Michelle K. Lee
*Deputy Director of the United States Patent and Trademark Office*